(12) United States Patent
Wang et al.

(10) Patent No.: US 9,026,747 B2
(45) Date of Patent: May 5, 2015

(54) MEMORY DEVICE WITH A LOGICAL-TO-PHYSICAL BANK MAPPING CACHE

(71) Applicant: Broadcom Corporation, Irvine, CA (US)

(72) Inventors: Weihuang Wang, Los Gatos, CA (US); Chien-Hsien Wu, Cupertino, CA (US); Mohammad Issa, Los Altos, CA (US)

(73) Assignee: Broadcom Corporation, Irvine, CA (US)

( * ) Notice: Subject to any disclaimer, the term of this patent is extended or adjusted under 35 U.S.C. 154(b) by 330 days.

(21) Appl. No.: 13/718,773

(22) Filed: Dec. 18, 2012

(65) Prior Publication Data

US 2014/0052912 A1    Feb. 20, 2014

Related U.S. Application Data

(60) Provisional application No. 61/729,977, filed on Nov. 26, 2012, provisional application No. 61/683,934, filed on Aug. 16, 2012.

(51) Int. Cl.

| G06F 12/00 | (2006.01) |
| G06F 13/00 | (2006.01) |
| G06F 13/28 | (2006.01) |
| G06F 12/08 | (2006.01) |
| G06F 12/02 | (2006.01) |
| G06F 12/06 | (2006.01) |
| G11C 8/00  | (2006.01) |
| G11C 7/10  | (2006.01) |

(52) U.S. Cl.
CPC .... *G06F 12/0802* (2013.01); *G11C 2207/2245* (2013.01); *G06F 2205/123* (2013.01); *G11C 7/1075* (2013.01); *G06F 12/0292* (2013.01); *G06F 12/06* (2013.01); *G06F 12/0853* (2013.01); *G11C 8/00* (2013.01)

(58) Field of Classification Search
CPC .................. G11C 7/1075; G11C 2207/2245; G11C 2205/123
USPC .......................................... 711/119, 150, 152
See application file for complete search history.

(56) References Cited

U.S. PATENT DOCUMENTS

| 2006/0075184 A1* | 4/2006 | Chen ............................ 711/104 |
| 2008/0259694 A1* | 10/2008 | Atwood et al. ........... 365/189.05 |
| 2011/0310691 A1* | 12/2011 | Zhou et al. ............... 365/230.03 |

\* cited by examiner

*Primary Examiner* — Ryan Bertram (74) *Attorney, Agent, or Firm* — Fiala & Weaver P.L.L.C.

(57) ABSTRACT

A memory device with a logical-to-physical (LTP) bank mapping cache that supports multiple read and write accesses is described herein. The memory device allows for at least one read operation and one write operation to be received during the same clock cycle. In the event that the incoming write operation is not blocked by the at least one read operation, data for that incoming write operation may be stored in the physical memory bank corresponding to a logical memory bank that is associated with the incoming write operation. In the event that the incoming write operation is blocked by the at least one read operation, then data for that incoming write operation may be stored in an unmapped physical bank that is not associated with any logical memory bank.

20 Claims, 7 Drawing Sheets

| Logical bank | 0 | 1 | 2 | 3 | 4 | 5 | 6 | 7 | 8 | 9 | 10 | 11 | Unmapped |
|---|---|---|---|---|---|---|---|---|---|---|---|---|---|
| Physical bank row 0 | 0 | 1 | 2 | 3 | 4 | 5 | 6 | 7 | 8 | 9 | 10 | 11 | 12 |
| Physical bank row 1 | 0 | 1 | 2 | 3 | 4 | 5 | 6 | 7 | 8 | 9 | 10 | 11 | 12 |

302

| Logical bank | 0 | 1 | 2 | 3 | 4 | 5 | 6 | 7 | 8 | 9 | 10 | 11 | Unmapped |
|---|---|---|---|---|---|---|---|---|---|---|---|---|---|
| Physical bank row 0 | 0 | 1 | 2 | 12 | 4 | 5 | 6 | 7 | 8 | 9 | 10 | 11 | 3 |
| Physical bank row 1 | 0 | 1 | 2 | 12 | 4 | 5 | 6 | 7 | 8 | 9 | 10 | 11 | 3 |

304

| Logical bank | 0 | 1 | 2 | 3 | 4 | 5 | 6 | 7 | 8 | 9 | 10 | 11 | Unmapped |
|---|---|---|---|---|---|---|---|---|---|---|---|---|---|
| Physical bank row 0 | 0 | 1 | 2 | 12 | 4 | 5 | 3 | 7 | 8 | 9 | 10 | 11 | 6 |
| Physical bank row 1 | 0 | 1 | 2 | 12 | 4 | 5 | 6 | 7 | 8 | 9 | 10 | 11 | 3 |

MEMORY DEVICE WITH A LOGICAL-TO-PHYSICAL BANK MAPPING CACHE

CROSS REFERENCE TO RELATED APPLICATION

This application claims priority to U.S. Provisional Application Ser. No. 61/683,934, filed Aug. 16, 2012, and U.S. Provisional Application Ser. No. 61/729,977, filed Nov. 26, 2012. Each of these applications is incorporated herein by reference.

BACKGROUND

1. Technical Field

The subject matter described herein relates to memory devices. In particular, the subject matter described herein relates to random-access memory (RAM) devices, such as static random-access memory (SRAM) devices.

2. Description of Related Art

High bandwidth, on-chip memory is required for a wide range of applications, including but not limited to multi-core processors, parallel computing systems, or the like. It would be beneficial if a high bandwidth, on-chip memory could be designed that could concurrently handle two read and two write accesses with low latency.

Single-port (SP) SRAM memory, which supports either one read or one write each clock cycle, is widely used for on-chip memory. Such memory can be extended to support two simultaneous read or write operations by running the internal memory core at twice the clock frequency, herein referred to as pseudo-dual-port (PD) memory. True dual-port memory can be designed to support two read or write operations as well, with less memory density and typically custom design.

4-port register files (RF) exist in the art. Such 4-port RF allows two read and two write operations to be performed simultaneously. They are typically custom designed and available only at a small number of bits, and are 3 times worse in area density as compared with single-port (SP) SRAM in a 40 nanometer (nm) General Purpose (40G) manufacturing process.

Dual-pumped dual-port (DDP) memory is another type of customized design currently being used. DDP memory uses internally a dual-port memory, which allows two simultaneous read or write operations, and runs internal memory at twice the clock frequency to allow for 4 simultaneous read or write operations. DDP memory consumes 70% more area and power as compared with SP and PD memory in a 40G manufacturing process.

BRIEF DESCRIPTION OF THE DRAWINGS/FIGURES

The accompanying drawings, which are incorporated herein and form a part of the specification, illustrate the subject matter of the present application and, together with the description, further serve to explain the principles of the embodiments described herein and to enable a person skilled in the pertinent art to make and use such embodiments.

The subject matter of the present application will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

A. Introduction

The following detailed description discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A memory device is described herein that realizes quad-port access at high speed with dual-ported memory banks. The memory device allows up to two read operations and two write operations to be received during the same clock cycle. The memory device consumes significantly less power and area as compared to custom-built DDP memory in a 40 G manufacturing process, especially with a larger memory configuration.

To support multiple read and write accesses, the memory device includes a plurality of physical memory banks and a cache for mapping a plurality of logical memory banks to the plurality of physical memory banks. The memory device includes at least one more physical memory bank than logical memory banks. The cache contains a plurality of LTP bank maps, each of which is stored in a corresponding cache line indexed by a unique read/write address within a physical memory bank. In a particular cache line, the number of logical memory banks is always fewer than the number of physical memory banks because of the extra physical memory bank. Thus, there is an unmapped physical memory bank that is not associated with any logical memory for any given cache line. In one clock cycle, the memory device can receive at least one read operation and one write operation that is configured to write data to a first logical memory bank. In the event that the write operation is not blocked by the at least one read operation, data associated with that incoming write operation may be stored in a physical memory bank corresponding to the first logical memory bank, wherein the correspondence between the physical memory bank and the first logical memory bank is determined by reading the appropriate LTP bank map. In the event that the incoming write operation is blocked, then data for that incoming write operation may be stored in a physical memory bank that is not currently mapped to any logical memory bank in the appropriate LTP bank map.

It is noted that the techniques described herein may be applied to other memory structures to allow for more same-cycle accesses than would otherwise be allowed by the physical memory banks included in the memory structure. For example, the techniques described herein may be applied to a single-port memory structure to enable such memory structure to support two-port access (i.e., one read or write and one write operation in the same cycle), or to a four-port memory structure to enable such memory structure to support eight-port access (i.e., four read and four write operations during the same clock cycle) at high speed.

Generally speaking, then, a memory device with a logical-to-physical bank mapping cache that supports multiple read and write accesses is described herein. The memory device includes a plurality of physical memory banks, at least one cache that is configured to store a LTP bank map, the LTP bank map associating each one of a plurality of logical memory banks with a corresponding one of the plurality of physical memory banks, and control logic coupled to each of the plurality of physical memory banks and to the at least one cache. The control logic is configured to determine whether a first incoming write operation configured to write data to a first logical memory bank in the plurality of logical memory banks is blocked by at least one incoming read operation. The control logic is further configured to write data associated with the first incoming write operation to a first physical memory bank that is associated with the first logical memory bank in the LTP bank map in response to determining that the first incoming write operation is not blocked by the at least one incoming read operation, and write data associated with the first incoming write operation to a second physical memory bank that is not associated with any logical memory bank in the LTP bank map in response to determining that the first incoming write operation is blocked by the at least one incoming read operation.

A method implemented by a memory device that includes a plurality of physical memory banks is also described herein. In accordance with the method, a determination is made whether a first incoming write operation configured to write data to a first logical memory bank in a plurality of logical memory banks is blocked by at least one incoming read operation. In response to determining that the first incoming write operation is not blocked by the at least one incoming read operation, data associated with the first incoming write operation is written to a first physical memory bank that is associated with the first logical memory bank in a LTP bank map. In response to determining that the first incoming write operation is blocked by the at least one incoming read operation, data associated with the first incoming write operation is written to a second physical memory bank that is not associated with any logical memory bank in the LTP bank map.

An apparatus in accordance with an embodiment of the present invention is also described herein. The apparatus includes control logic configured to be coupled to a plurality of memory banks and at least one cache. The control logic is configured to determine whether a first incoming write operation configured to write data to a first logical memory bank in a plurality of logical memory bank is blocked by at least one incoming read operation. The control logic is further configured to write data associated with the first incoming write operation to a first physical memory bank that is associated with the first logical memory bank in a LTP bank map in response to determining that the first incoming write operation is not blocked by the at least one incoming read operation, and write data associated with the first incoming write operation to a second physical memory bank that is not associated with any logical memory bank in the LTP bank map in response to determining that the first incoming write operation is blocked by the at least one incoming read operation.

B. Example Memory Device with a Logical-to-Physical Bank Mapping Cache

Figure 1:
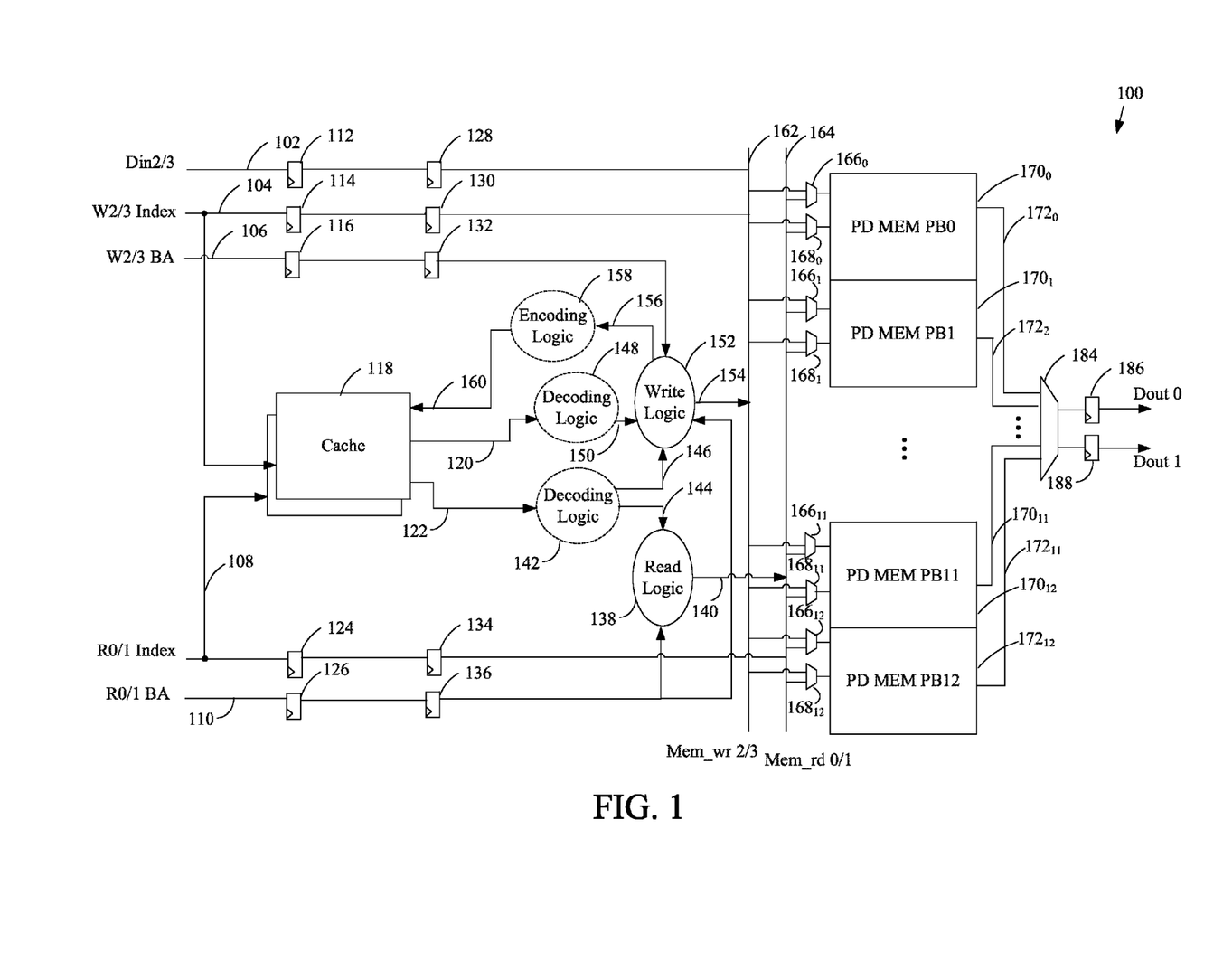
FIG. 1 is a block diagram of a memory in accordance with an embodiment.

FIG. 1 is block diagram of a memory device 100 in accordance with an embodiment. Memory device 100 is an SRAM, although the techniques described herein may be implemented in other types of memories. As shown in FIG. 1, memory device 100 includes at least one cache 118, read logic 138, write logic 152, and a plurality of physical memory banks $170_0$-$170_{12}$. Memory device 100 may also optionally include decoding logic 142, decoding logic 148, and encoding logic 158. These components will be further described below.

Memory device 100 is configured to receive a plurality of write signals associated with first and second incoming write operations via a plurality of write signal lines. The plurality of write signal lines includes a clock signal line, a write control signal line, write address signal lines, and write data signal lines. The clock signal line carries a clock signal that controls the timing of incoming write operations. The write control signal line carries a write control signal 162 that, when asserted, indicates an incoming write operation is being received by memory device 100. For instance, when asserted high, write control signal 162 may indicate that an incoming write operation is being received. When asserted low, write control signal 162 may indicate that an incoming read operation is being received.

The write data signal lines are utilized to carry write data signals 102, which may be referred to as "write data," that are to be written to memory device 100. The write address signal lines are utilized to carry write address signals that identify memory locations to which data is to be written. For example, a first set of one or more write address signals identifies one or more of logical memory banks associated with physical memory banks $170_0$-$170_{12}$ to which data is to be written, and thus may be referred to as write bank address signals 106. A second set of one or more write address signals identifies a location within a memory bank to which data is to be written, and thus may be referred to as write index signals 104.

Memory device 100 is further configured to receive a plurality of read signals via a plurality of read signal lines. The plurality of read signal lines includes a clock signal line, a read control signal line, and read address signal lines. The clock signal line carries a clock signal that controls the timing of incoming read operations. In an embodiment, both the clock signal for an incoming write operation and the clock signal for an incoming read operation are received from the same clock signal line. In another embodiment, the clock signal for an incoming write operation is received from a clock signal line that is different from the one used for an incoming read operation. The read control signal line carries a read control signal 164 that, when asserted, indicates an incoming read operation is being received by memory device 100. The read address signal lines carry read address signals that identify memory locations from which data is to be read. For example, a first set of one or more read address signals identifies one of logical memory banks associated with one of physical memory banks $170_0$-$170_{12}$ from which data is to be read, and thus may be referred to as read bank address signals 110. A second set of one or more read address signals identifies a location within a memory bank from which data is to be read, and thus may be referred to as read index signals 108.

In an embodiment, memory device 100 includes a single set of address signal lines that are configured to carry both the read address signals and the write address signals. Similarly, memory device 100 may also include a single set of data signal lines that are configured to carry both the data to be read from memory device 100 and the data to be written to memory device 100. In accordance with such an embodiment, a read output enable signal may be used to differentiate the data being carried via the single set of data signal lines. For example, the assertion of a read output enable signal may indicate that data read from memory device 100 is being carried via the single set of data signal lines. When not asserted, the read output enable signal may indicate that data to be written to memory device 100 is being carried via the single set of data signal lines.

As shown in FIG. 1, memory device 100 includes thirteen physical memory banks $170_0$-$170_{12}$. However, persons skilled in the relevant art(s) will recognize that any number of physical memory banks may be included in memory device 100. Each of physical memory banks $170_0$-$170_{12}$ may include memory cells that are arranged in rows and columns. Each of physical memory banks $170_0$-$170_{12}$ may be configured to include the same number of memory cells. Each memory cell may be configured to store a bit of data and has a unique address defined by the intersection of a row and a column. Data may be read from or written to a row of any physical memory banks $170_0$-$170_{12}$ via an incoming read or write operation, respectively.

For an incoming write operation, write index signals 104 are input into cache 118 and to multiplexers (MUXes) $166_0$-$166_{12}$ and $168_0$-$168_{12}$, write bank address signals 106 are input into write logic 152, and write control signal 162 is asserted. Write logic 152 uses write bank address signals 106 along with information obtained from cache 118 to identify which one of physical memory banks $170_0$-$170_{12}$ data is to be written and outputs a bank select signal 154 that selects the identified physical memory bank to which data is written. MUXes $166_0$-$166_{12}$ and $168_0$-$168_{12}$ are configured to select the row within the identified physical memory bank to which data is written. Two operations, read or write, may be realized in the same clock cycle because of the two set of MUXes $166_0$-$166_{12}$ and $168_0$-$168_{12}$, a set for each operation. When asserted, write control signal 162 enables write data signals 102 to be written into the selected row in the identified physical memory bank.

For an incoming read operation, read index signals 108 are input into cache 118 and to MUXes $166_0$-$166_{12}$ and $168_0$-$168_{12}$, and read bank address signals 110 are input into read logic 138. Read logic 138 uses read bank address signals 110 along with information obtained from cache 118 to identify from which one of physical memory banks $170_0$-$170_{12}$ data is to be read and outputs a bank select signal 140 that selects the identified physical memory bank from which data is to be read. MUXes $166_0$-$166_{12}$ and $168_0$-$168_{12}$ are configured to select the row within the identified physical memory bank from which data is to be read. When asserted, read control signal 162 enables data to be read from the selected row in the identified physical memory bank.

Each of physical memory banks $170_0$-$170_{12}$ is dual-ported, and each port is operable to receive either one incoming read operation or one incoming write operation during the same clock cycle. Accordingly, each of physical memory banks $170_0$-$170_{12}$ may receive two incoming read operations, two incoming write operations, or one incoming read operation and one incoming write operation during the same clock cycle. Furthermore, because memory device 100 may be configured to receive two incoming read operations and two incoming write operations during the same clock cycle, any four given physical memory banks $170_0$-$170_{12}$ may be accessed during the same clock cycle. Accordingly, bank select signals 154 and 140 may include four bank select signals to either the same or different memory banks during the same clock cycle. Furthermore, because each of physical memory banks $170_0$-$170_{12}$ supports two incoming read operations, each of physical memory banks $170_0$-$170_{12}$ may be configured to output two set of output data signals $172_0$-$172_{12}$.

In the embodiment shown in FIG. 1, an incoming write operation may be blocked by two or more incoming read or write operations if all of the operations are directed to the same physical memory bank during the same clock cycle. Read operations are given priority, and thus are never blocked. The incoming write operation is blocked because a physical memory bank cannot support more than two accesses in one clock cycle. As will be discussed below, write data for the incoming write operation that is blocked is stored in an "unmapped" physical memory bank, which may be determined from an LTP bank map in cache 118.

Figure 2:
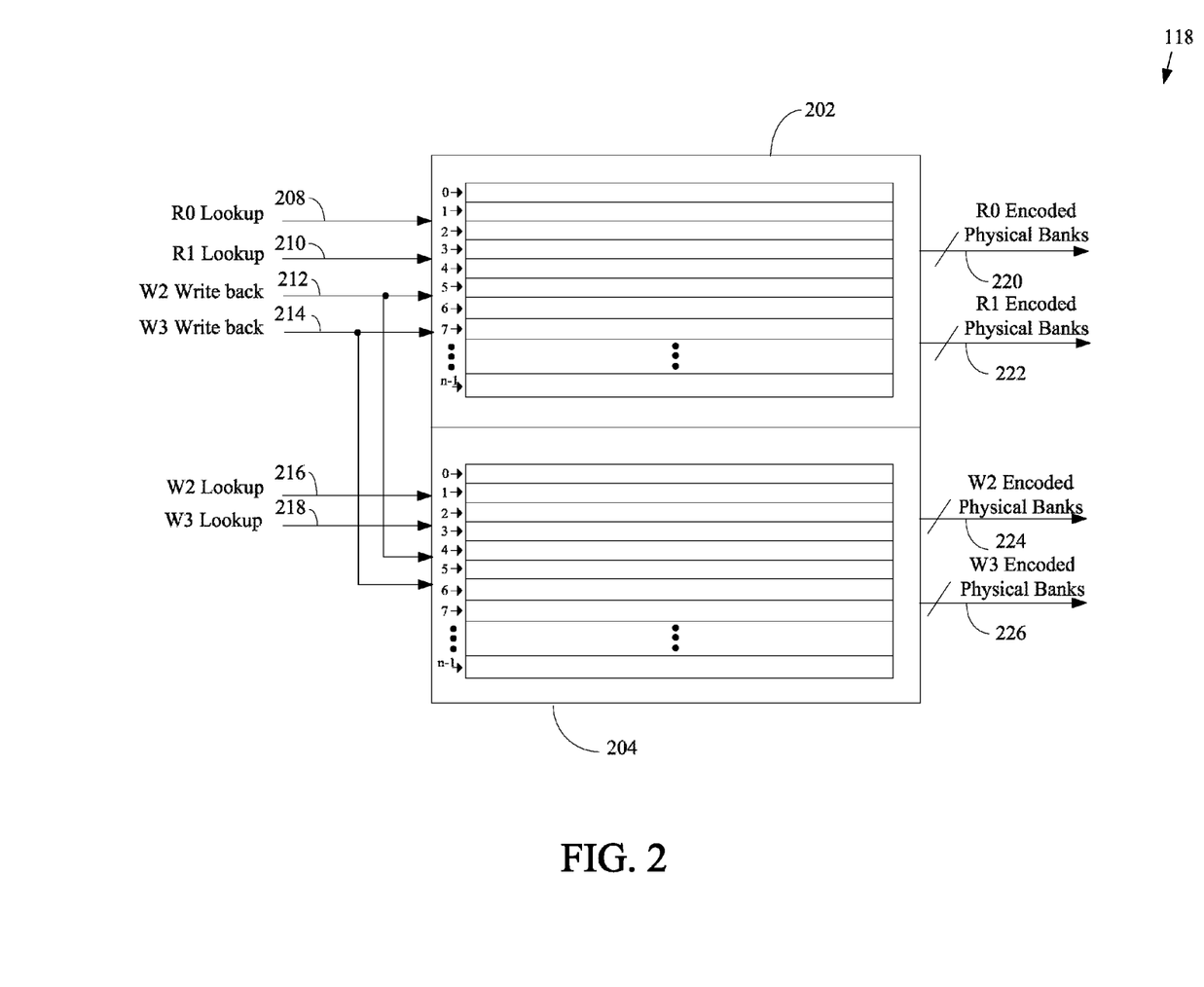
FIG. 2 is a block diagram of a cache that includes a logical-to-physical (LTP) bank map that may be used to implement a memory in accordance with an embodiment.

FIG. 2 is a block diagram of cache 118 in accordance with one embodiment. As will be discussed herein, cache 118 includes an LTP bank map. Two four-port register files 202 and 204 may be used to store the LTP bank map. Register files 202 and 204 are configured to be read independently but any data written to register file 202 is also concurrently written to register file 204 to ensure data consistency. Each of register files 202 and 204 contains 0-(n−1) cache lines, where n is equal to the number of rows in each physical memory bank $170_0$-$170_{12}$. Register file 204 is essentially a mirror or shadow of register file 202, such that the two register files contain the same data. The mirrored nature of registered files 202 and 204 advantageously allows four read and two write cache lookup operations to be performed during the same clock cycle. Each cache line is configured to store an index-specific LTP bank map, which may be considered an entry/row in a larger LTP bank map, the management of which will be further described below in reference to FIG. 3.

Figure 3:
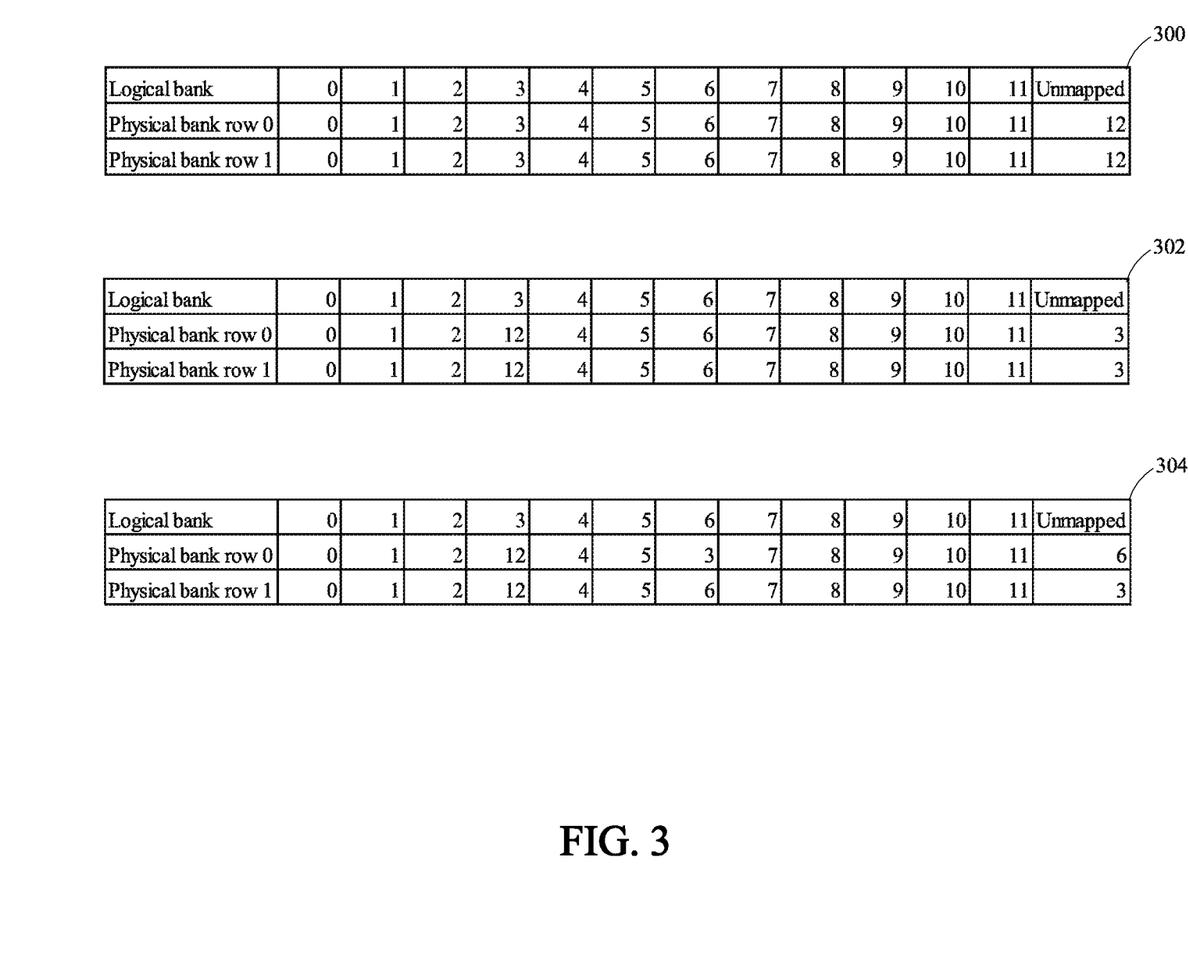
FIG. 3 illustrates management of a logical-to-physical bank map in accordance with an embodiment.

FIG. 3 illustrates the management of an LTP bank map in accordance with an embodiment. As shown in FIG. 3, an LTP bank map 300 holds an association of logical memory banks to corresponding physical memory banks. LTP bank map 300 contains at least the same number of rows as the number of rows of each of the physical memory banks, and each row is stored in a cache line of cache 118. For example, if a physical memory bank contains 2048 rows, then LTP bank map 302 and cache 118 also contains at least 2048 rows that are numbered from 0 to 2047. There are fewer logical memory banks than there are physical memory banks. Thus, logical memory banks are fully mapped to corresponding physical memory banks, leaving one remaining physical memory bank that is not mapped to any logical memory bank. The association of physical memory banks to logical memory banks is performed on a row-by-row basis, such that a row of LTP bank map 300 or cache line includes a mapping of n logical memory banks to n+1 physical memory banks. As a result, for every row in LTP bank map 300, there is always one physical memory bank that is not associated with any logical memory bank. This physical memory bank is referred to as an unmapped physical memory bank.

In one embodiment, LTP bank map 300 maps twelve logical memory banks to thirteen physical memory banks, such as the thirteen physical memory banks $170_0$-$170_{12}$ shown in FIG. 1. For a cache line or row i, each logical memory bank is mapped to a corresponding physical memory bank, such that each cache line includes a plurality of physical memory bank identifiers indexed by corresponding logical memory bank identifiers. Suppose each of the thirteen physical memory banks has 2048 rows, then initially for each row i from 0 to 2047, logical memory banks 0-11 are mapped to physical memory banks 0-11 respectively, and physical memory bank 12 is unmapped to any logical memory bank. For example, in physical memory bank row 0 of LTP bank map 300, logical memory bank 3 is mapped to physical memory bank 3. Thus, when an incoming write operation is received that is directed to index 0 of logical memory bank 3, cache line 0 is consulted to determine that logical memory bank 3 is mapped to physical memory bank 3. If the incoming write operation is not blocked by two other incoming read or write operations, then the data associated with the incoming write operation will be written to physical memory bank 3, index 0.

FIG. 3 also depicts a modified version of LTP bank map 300, denoted first updated LTP bank map 302. First updated LTP bank map 302 is intended to show how LTP bank map 300 is modified when a first incoming write operation to logical memory bank 3, index 0, and a second incoming write operation to logical memory bank 3, index 1, are both blocked by two incoming read operations to logical memory bank 3. In this case, all incoming writes and reads are mapped to the same physical memory bank—physical memory bank 3. This is why both incoming writes are blocked. Consequently, the write data associated with each of the two blocked incoming write operations is written to unmapped physical memory bank 12 rather than physical memory bank 3. In particular, the write data associated with the first incoming write operation to logical memory bank 3, index 0, is written to physical memory bank 12, index 0, and the write data associated with the second incoming write operation to logical memory bank 3, index 1, is written to physical memory bank 12, index 1. LTP bank map 300 is then updated to associate logical memory bank 3 with physical memory bank 12 for both index 0 and index 1 as shown in first updated LTP bank map 302. LTP bank map 300 is also updated to disassociate physical memory bank 3 from any logical memory bank for both index 0 and index 1 as further shown in first updated LTP bank map 302. A similar approach is used when a single incoming write is blocked by two incoming read operations, or by an incoming read and an incoming write operation.

FIG. 3 further depicts a modified version of first updated LTP bank map 302, denoted second updated LTP bank map 304. Second updated LTP bank map 304 is intended to show how first updated LTP bank map 302 is modified when an incoming write operation to logical memory bank 6, index 0, is blocked by two other incoming read or write operations to logical memory bank 6. In this case, one incoming read is mapped to physical memory bank 6 and two incoming writes are mapped to physical memory bank 6. This is why the incoming write to logical memory bank 6, index 0, is blocked. Consequently, the write data associated with the blocked incoming write operation is written to currently unmapped physical memory bank 3 rather than physical memory bank 6. In particular, the write data associated with the incoming write operation to logical memory bank 6, index 0, is written to physical memory bank 3, index 0. First updated LTP bank map 302 is then updated to associate logical memory bank 6 with physical memory bank 3 for index 0 as shown in second updated LTP bank map 304. LTP bank map 300 is also updated to disassociate physical memory bank 6 from any logical memory bank for index 0 as further shown in second updated LTP bank map 304. The incoming write to logical memory bank 6, index 1, is not blocked. Consequently, the write data associated with this incoming write operation is written to physical memory bank 6, index 1. This process of associating and disassociating physical memory banks to and from corresponding logical memory banks may be continued for every incoming write operation that is blocked. Thus, the LTP bank map continues to be shuffled to maintain a current mapping of logical to physical memory banks.

Referring back to FIG. 2, cache lines 0-(n-1) are accessed via read and write cache lookup operations. Each cache line stores a plurality of physical memory bank identifiers, each of which is indexed by a corresponding logical memory bank identifier. In the embodiment shown in FIG. 1, in which there are 13 physical memory banks $170_0$-$170_{12}$, a physical memory bank identifier may be represented by a 4-bit value. As shown in FIG. 2, register file 202 is configured to receive R0 lookup signals 208 corresponding to an R0 lookup operation, R1 lookup signals 210 corresponding to an R1 lookup operation, W2 lookup signals 216 corresponding to a W2 lookup operation, W3 lookup signals 218 corresponding to a W3 lookup operation, W2 write back signals 212 corresponding to a W2 write back operation, and W3 write back signals 214 corresponding to a W3 write back operation. Such operations may all be applied to cache 118 during the same clock cycle by cache 118.

In particular, register file 202 is configured to receive R0 lookup signals 208 and R1 lookup signals 210, corresponding to read index signals 108, for first and second incoming read operations. When an incoming read operation is received, an R0 lookup operation and/or an R1 lookup operation is performed using read index signals 108 associated with that incoming read operation. A particular cache line is selected using read index signals 108. Contents of the selected cache line are output via cache output signals 220 and 222, corresponding to R0 lookup signals 208 and R1 lookup signals 210, respectively. For example, if the received read index is 2047, then cache line 2047 is output. The number of cache lines that are output is equal to the number of incoming read operations. For example, two cache lines are selected and output if there are two incoming read operations.

Register file 202 is also configured to receive W2 write back signals 212 and W3 write back signals 214. W2 write back signals 212 comprise an updated cache line associated with a first incoming write operation, wherein such updated cache line includes an updated LTP bank map. The W2 write back operation is performed whenever an LTP bank map within cache 118 must be updated due to the first incoming write operation being blocked. W3 write back signals 214 comprise an updated cache line associated with a second incoming write operation, wherein such updated cache line includes an updated LTP bank map. The W3 write back operation is performed whenever an LTP bank map within cache 118 must be updated due to the second incoming write operation being blocked.

Register file 204 is also configured to receive W2 lookup signals 216 and W3 lookup signals 218, corresponding to write address index signals 104, for first and second incoming write operations. When an incoming write operation is received, a W2 lookup operation and/or a W3 lookup operation is performed using write index signals 104 associated with that incoming write operation. A particular cache line is selected using write index signals 104. Contents of the selected cache line are output via cache output signals 224 and 226, corresponding to W2 lookup signals 216 and W3 lookup signals 218, respectively. The number of cache lines that are output is equal to the number of incoming write operations. For example, one cache line is selected and output if there is only one incoming write operation.

Referring back to FIG. 1, read logic 138 is configured to receive read signals, including read bank address signals 110, and information from cache 118 (e.g., cache lines) via cache output signals 122, which include cache output signals 220 and 222 shown in FIG. 2. Read logic utilizes the information obtained from cache 118 to map a logical memory bank specified by read bank address signals 110 to a physical memory bank. For example, referring to second updated LTP bank map 304 of FIG. 3, if an incoming read operation is directed to logical memory bank 6, index 0, then read logic 138 will use the cache line associated with index 0 to determine that logical memory bank 6 should be mapped to physical memory bank 3.

After identifying the physical memory banks corresponding to the logical memory banks of the incoming read operations, read logic 138 asserts bank select signals 140. Bank select signals 140 are received by MUXes $166_0$-$166_{12}$ and used to determine which physical memory bank among physical memory banks $170_0$-$170_{12}$ a first incoming read operation is to be applied to. Bank select signals 140 are also received by MUXes $168_0$-$168_{12}$ and used to determine which physical memory bank from among physical memory banks $170_0$-$170_{12}$ a second incoming read operation is to be applied to. When read control signal 164 is asserted, one of MUXes $166_0$-$166_{12}$ will operate to cause data to be read from a physical memory bank specified by bank select signals 140 and an index specified by read index signals 108 and/or one of MUXes $168_0$-$168_{12}$ will operate to cause data to be read from a physical memory bank specified by bank select signals 140 and an index specified by read index signals 108. Data read from each physical memory bank in this manner is output via output signals $172_0$-$172_{12}$. Output data signals $172_0$-$172_{12}$ are input into a MUX 184. In an embodiment, output data received from MUX 184 is sent to a scan test flip flop 186 or 188 to assist in debug of memory device 100 before being output as $D_{out}$ 0 and/or $D_{out}$ 1, corresponding to the first incoming read operation and the second incoming read operation, respectively.

Cache lookup operations may take one or more clock cycles to complete. In the example implementation shown in FIG. 1, cache lookup operations take two clock cycles. Accordingly, read index signals 108 and read bank address signals 110 are delayed two clock cycles, via flip flops 124, 126, 134, and 136 before being received by read logic 138, MUXes $166_0$-$166_{12}$, and MUXes $168_0$-$168_{12}$. Additional details concerning the operation of read logic 138 will be provided below in reference to FIGS. 5 and 6.

As shown in FIG. 1, write logic 152 is configured to receive write signals, including write bank address signals 106, read bank address signals 110, and information from cache 118 (e.g., cache lines) via cache output signals 120, which include cache output signals 224 and 226 shown in FIG. 2. Write logic 152 utilizes the information obtained from cache 118 to map a logical memory bank specified by write bank address signals 106 to a physical memory bank. For example, referring to first updated LTP map 302 of FIG. 3, if an incoming write operation is directed to logical memory bank 3, index 0, then write logic 152 will use the cache line associated with index 0 to determine that logical memory bank 3 should be mapped to physical memory bank 12.

After identifying the physical memory banks corresponding to the logical memory banks of the incoming write operations, write logic 152 determines whether an incoming write operation is blocked by two or more incoming read or write operations as previously described in reference to FIG. 3. Write logic 152 may utilize write bank address signals 106 and read bank address signals 110 to determine whether an incoming write operation is blocked by an incoming read or write operation. Write logic 152 is configured to compare the physical memory banks targeted by incoming read and write operations to determine if they are the same. If the physical memory bank targeted by a first incoming write operation is the same as the physical memory bank targeted by two incoming read operations or one incoming read operation and one incoming write operation, then write logic 152 may determine that the first incoming write operation is blocked by the two or more incoming read or write operations.

In response to determining that an incoming write operation is not blocked, write logic 152 is configured to cause the write data associated with the unblocked incoming write operation to be written to the physical memory bank that is currently associated with the logical memory bank specified by the unblocked incoming write operation. In response to determining that an incoming write operation is blocked, write logic 152 is configured to cause the write data associated with the blocked incoming write operation to be written to a physical memory bank that is not currently mapped to any logical memory bank in cache 118. The unmapped physical memory bank is determined by analyzing the information received from cache 118 (e.g., cache lines) via cache output signals 120. For a particular cache line received, write logic 152 is configured to determine which of the thirteen physical memory banks $170_0$-$170_{12}$ is not associated with any logical memory bank. For example, as shown in physical bank row 0 of LTP bank map 300, physical banks 0-11 are mapped to logical banks 0-11. The only remaining unmapped physical memory bank is bank 12.

Write logic 152 controls which physical memory banks are selected for incoming write operations by asserting bank select signals 154. Bank select signals 154 are received by MUXes $166_0$-$166_{12}$ and used to determine which physical memory bank among physical memory banks $170_0$-$170_{12}$ a first incoming write operation is to be applied to. Bank select signals 154 are also received by MUXes $168_0$-$168_{12}$ and used to determine which physical memory bank among physical memory banks $170_0$-$170_{12}$ a second incoming write operation is to be applied to. When write control signal 162 is asserted, one of MUXes $166_0$-$166_{12}$ will operate to cause data to be written to a physical memory bank specified by bank select signals 154 and an index specified by write index signals 104 and/or one of MUXes $168_0$-$168_{12}$ will operate to cause data to be written to a physical memory bank specified by bank select signals 154 and an index specified by write index signals 104. Write logic 152 is further configured to update the LTP bank map stored in cache 118 whenever write logic 152 changes the mapping between a logical memory bank and a physical memory bank. In particular, when dealing with a blocked incoming write operation, write logic 152 is configured to update the LTP bank map by associating an unmapped physical memory bank with the logical memory bank specified by the blocked incoming write operation. Write logic 152 is further configured to update the LTP bank map by disassociating the physical memory bank previously associated with the logical memory bank specified by the blocked incoming write operation from any other logical memory bank, thereby causing this physical memory bank address to be the currently unmapped physical memory bank.

Write logic 152 is configured to provide the updates to cache 118 as signals 156, which may comprise a modified version of the cache line received as cache output signals 120. Such updates to the LTP bank map are written to cache 118 as W2 write back signals 212 or W3 write back signals 214.

As mentioned above, cache lookup operations may take one or more clock cycles to complete. In the example implementation shown in FIG. 1, cache lookup operations take two clock cycles. Accordingly, write data signals 102, write index signals 104, and write bank address signals 106 are delayed by two clock cycles, via flip flops 112, 114, 116, 128, 130, and 132 before being received by write logic 152, MUXes $166_0$-$166_{12}$, and MUXes $168_0$-$168_{12}$. Additional details concerning the operation of write logic 152 will be provided below in reference to FIG. 7.

It is noted that while the embodiments described above describe that an incoming write operation may be blocked by two or more incoming read or write operations, in an embodiment, an incoming write operation may be blocked by a single incoming read or write operation that is received during the same clock cycle as the incoming write operation.

C. Optional Cache Line Encoding and Decoding Scheme

In an embodiment, the process of updating the LTP bank map stored in cache 118 involves an optional encoding of signals 156, which may be a modified version of the cache line received as cache output signals 120. The encoding of signals 156 may be performed by encoding logic 158 as shown in FIG. 1. Encoding logic 158 is configured to encode each of the physical memory bank identifiers included in a row of the LTP bank map in cache 118, resulting in a compressed, shorter cache line. This compression also effectively reduces the width of the LTP bank map. Encoding logic 158 is further configured to output an encoded cache line as output signals 160, which includes W2 and W3 write back signals 212 and 214, to cache 118. In further accordance with such an embodiment, cache lines read from cache 118 and provided to read logic 138 and write logic 152 must be decoded. Such decoding operations are performed by decoding logic 142 and decoding logic 150.

Several levels/types of coding may be performed to compress the cache lines of the LTP bank map. Table 1 compares different types of coding for a few example configurations of logical memory banks n.

TABLE 1

Comparison of coding types

| Number of logical memory banks n | Width of LTP map in terms of bits | | | |
|---|---|---|---|---|
| | No coding | Simple coding | Complex Coding | Theoretical minimum |
| 4 | 15 | 11 | 8 | 7 |
| 8 | 36 | 28 | 21 | 19 |
| 12 | 59 | 48 | 37 | 33 |
| 16 | 85 | 69 | 54 | 49 |

Generally, for n logical memory banks, the normal width of each LTP bank map row may be determined by a first equation, $\lfloor (n+1)[\log_2(n)+1] \rfloor$, where n is equal to the number of logical memory banks. This normal width is shown in Table 1 in the "No coding" column.

A simple encoding process reduces the width of each LTP bank map row according to a second equation, $\lfloor (n+1)\lfloor \log_2(n+1) \rfloor \rfloor$, where n is equal to the number of logical memory banks. This simple encoding process comes from the observation that one last physical bank, let it be the unmapped physical memory bank, does not have to be stored in the LTP bank map. For example, as shown in physical bank row 1 of LTP bank map 300, physical memory banks 0-11 are mapped to logical memory banks 0-11. The only remaining physical memory bank that is not mapped to a logical memory bank is physical memory bank 12. Thus, in this manner, the unmapped physical memory bank may be determined for a particular row in LTP bank map 300.

A theoretical minimum width for a LTP bank map row may be calculated with a third equation, $\lceil \log_2[(n+1)!] \rceil$, where n is equal to the number of logical memory banks. However, in order to achieve this theoretical minimum width, multiplication and division logic, which may be complicated and slow, must be used. A more practical approach is to use a complex but calculable encoding process to further reduce the width of the LTP bank map, such that the LTP bank map is even more compressed than with the simple encoding process. The encoding process involves the following steps:

(a) representing a first physical memory bank identifier in a received cache line using a first number of bits. For example, suppose the cache line contains a mapping of 4 logical memory banks $a_0$-$a_4$ to 5 physical memory banks 0-4, in this unencoded configuration: $\{a_0, a_1, a_2, a_3, a_4\}=\{2, 4, 1, 0, 3\}$. In accordance with this step, the first physical memory bank identifier, 2 of $\{2, 4, 1, 0, 3\}$, is represented using 3 bits as 3' d2 in a new encoded cache line.

(b) removing the first physical memory bank identifier from an ordered sequence of physical memory bank identifiers. To continue with the example in (a), the first physical memory bank identifier in the cache line, 2, is removed from an ordered sequence of physical memory bank identifiers $\{0, 1, 2, 3, 4\}$, resulting in the ordered sequence $\{0, 1, 3, 4\}$.

(c) determining a number of bits required to represent the positions of each of the remaining physical memory bank identifiers in the ordered sequence of physical memory bank identifiers. To continue with example in (b), the maximum number of bits needed to represent a position of each of the remaining physical memory bank identifiers in the ordered sequence of physical memory bank identifiers $\{0, 1, 3, 4\}$ is 2 bits, since there are four positions.

(d) representing a position in the ordered sequence of physical memory bank identifiers of a next physical memory bank identifier in the cache line using the number of bits determined in step (c). To continue with the example in (c), the next physical memory bank in the cache line $\{2, 4, 1, 0, 3\}$ is 4. Physical memory bank 4 is located in position 3 (of positions 0-3) of the ordered sequence $\{0, 1, 3, 4\}$. Thus, in accordance with this step, 2'd3, which is a representation of position 3 using 2 bits, is added to the new encoded cache line.

(e) removing the next physical memory bank identifier from the ordered sequence of physical memory bank identifiers. To continue with the example in (d), the physical memory bank identifier 4 is removed from the ordered sequence of physical memory bank identifiers $\{0, 1, 3, 4\}$, resulting in the ordered sequence $\{0, 1, 3\}$.

(f) repeating steps (c), (d), (e) until there is only one physical memory bank identifier left in the ordered sequence.

i. The maximum number of bits needed to represent a position of each of the remaining physical memory bank identifiers in the ordered sequence of physical memory bank identifiers {0, 1, 3} is 2 bits, since there are three positions.

ii. The next physical memory bank in the cache line {2, 4, 1, 0, 3} is 1. Physical memory bank 1 is located in position 1 (of positions 0-2) of the ordered sequence {0, 1, 3}. Thus, in accordance with this step, 2'd1, which is a representation of position 1 using 2 bits, is added to the new encoded cache line.

iii. The physical memory bank identifier 1 is removed from the ordered sequence of physical memory bank identifiers {0, 1, 3}, resulting in the ordered sequence {0, 3}.

iv. The maximum number of bits needed to represent a position of each of the remaining physical memory bank identifiers in the ordered sequence of physical memory bank identifiers {0, 3} is 1 bit, since there are two positions. The next physical memory bank in the cache line {2, 4, 1, 0, 3} is 0. Physical memory bank 0 is located in position 0 (of positions 0-1) of the ordered sequence {0, 3}. Thus, in accordance with this step, 1'd0, which is a representation of position 0 using 1 bit, is added to the new encoded cache line.

v. The physical memory bank identifier 0 is removed from the ordered sequence of physical memory bank identifiers {0, 3}, leaving only physical memory bank identifier 3 in the ordered sequence. Thus, the encoding stops at this point as physical memory bank identifier 3 does not need to be represented explicitly.

The end result of the above encoding example is an encoded cache line having this configuration, $\{s_0, s_1, s_2, s_3\}=\{3'd2, 2'd3, 2'd1, 1'd0\}$. In this example, the original width of the received cache line is 15 bits, and the width of the new encoded cache line has been reduced to 8 bits.

In an embodiment in which the cache lines of cache 118 are encoded, decoding logic 142 is configured to decode cache output signals 122. In an embodiment, decoding logic 142 is configured to decode encoded cache lines using 2-to-1 multiplexers in n levels, where n is equal to the number of logical memory banks. Decoding logic 142 is configured to output signals 144 and 146, which are essentially decoded versions of cache output signals 122 as shown in FIG. 1. In an example where the number of logical memory banks is 4, encoded cache lines associated with output signals 122 may be 8 bits long. After being decoded by decoding logic 142, the same cache lines, which are no longer encoded, may be 15 bits long. Read logic 138 may receive output signals 144 as an LTP map from which a physical memory bank may be determined for a given logical memory bank associated with an incoming read operation. Output signals 146 are the same as output signals 144. In order to determine if an incoming write operation is blocked by an incoming read operation, write logic 152 may receive the LTP map as output signals 146, and based on this information, determine whether the write operation and the read operation are targeting the same physical memory bank.

The encoding and decoding processes described above are optional, and in case of very high clock frequency or very large number of memory banks, encoding and decoding may become difficult to perform without negatively impacting read latency.

Figure 4:
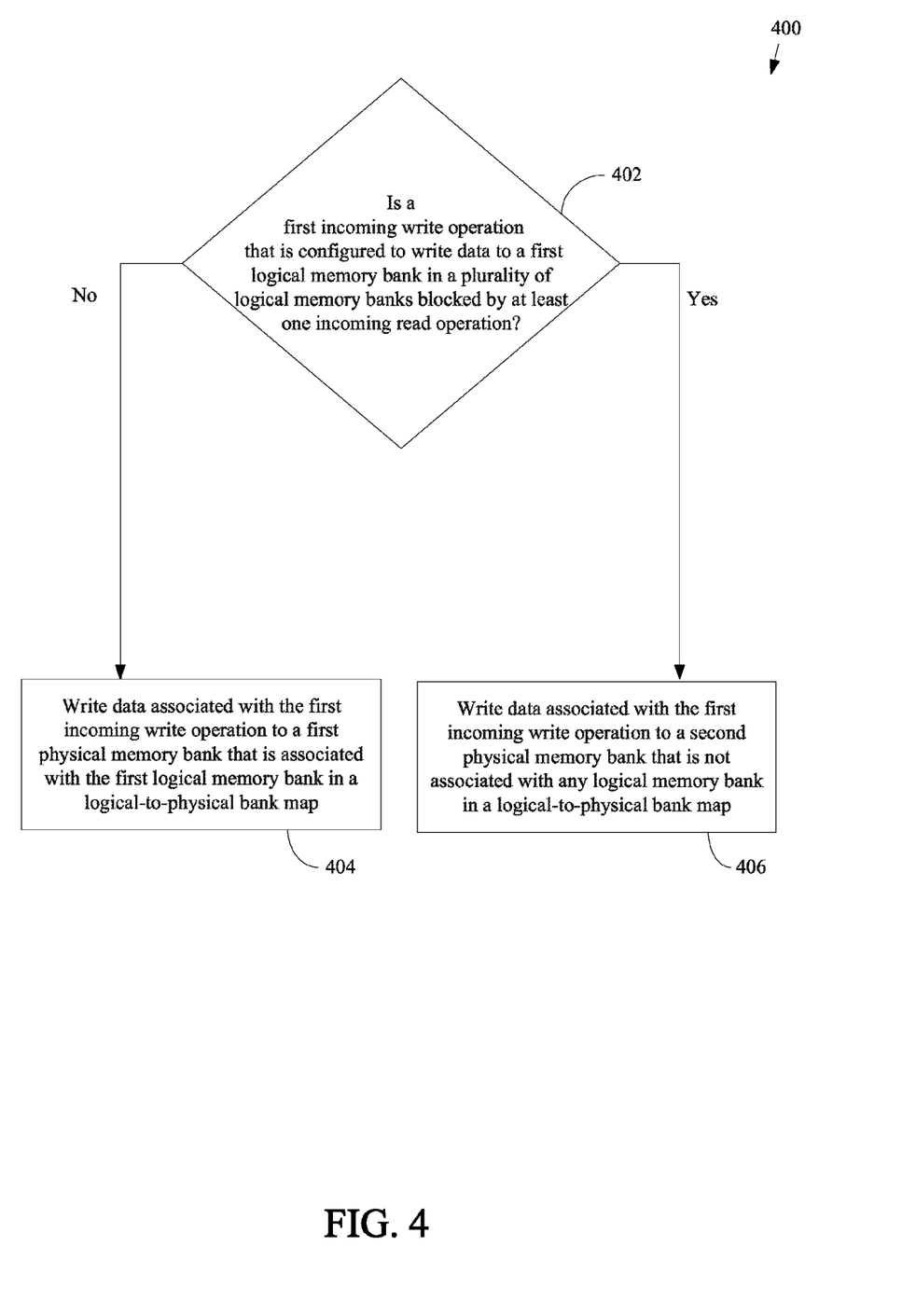
FIG. 4 depicts a flowchart of a method for determining whether write data is to be written to a physical memory bank that is associated with a logical memory bank or a physical memory bank that is not associated with a logical memory bank in an embodiment.

D. Example Methods Utilizing a Logical-to-Physical Bank Mapping Cache to Enable Multiple Read and Write Accesses to a Memory Device FIG. 4 depicts a flowchart 400 of an example method for determining whether write data is to be written to a physical memory bank that is associated with a logical memory bank or a physical memory bank that is not associated with a logical memory bank in an embodiment. The method of flowchart 400 will now be described with continued reference to example memory device 100 of FIG. 1, although the method is not limited to that implementation.

As shown in FIG. 4, the method of flowchart 400 begins at step 402, in which write logic 152 determines whether a first incoming write operation that is configured to write data to a first logical memory bank in a plurality of logical memory banks is blocked by at least one incoming read operation. Write logic 152 may determine that the first incoming write operation is blocked by the at least one incoming read operation if a physical memory bank associated a logical memory bank that is targeted by the incoming read operation is the same as the physical memory bank associated with the first logical memory bank. If write logic 152 determines that the first incoming write operation is blocked, then the flow continues to step 406. Otherwise, the flow continues to step 404.

In the example embodiment shown in FIG. 1, write logic 152 may determine that an incoming write operation is blocked by two or more incoming read or write operations (e.g., two incoming read operations, one incoming read operation and one incoming write operation, or two incoming read operations and one incoming write operation) if a physical memory bank associated with each of the two or more incoming read or write operations is the same as the physical memory bank associated with the first logical memory bank. If the incoming write operation is blocked by two incoming read operations, the two read operations will take precedence and the incoming write operation is blocked. In the event that the incoming write operation is blocked by one incoming read operation and one incoming write operation then one of the two incoming write operations may be given priority by design. Thus, it is possible that the first incoming write operation will not be blocked by the other incoming write operation.

At step 404, data associated with the first incoming write operation is written to a first physical memory bank, such as one of memory banks $170_0$-$170_{12}$, that is associated with the first logical memory bank in a LTP bank map in response to write logic 152 determining the first incoming write operation is not blocked by the at least one incoming read operation.

At step 406, data associated with the first incoming write operation is written to a second physical memory bank that is not associated with any logical memory bank in a LTP bank map in response to write logic 152 determining that the first incoming write operation is blocked by the at least one incoming read operation.

Figure 5:
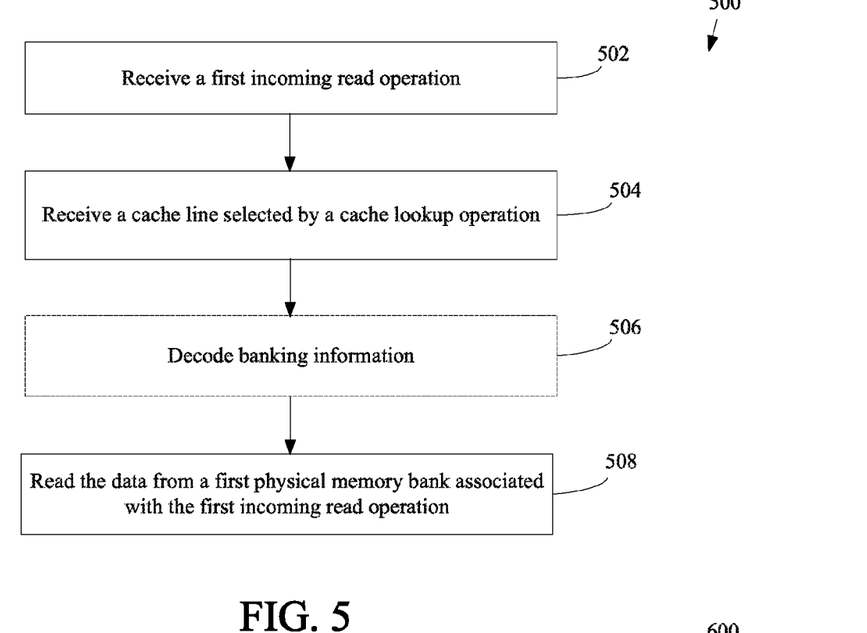
FIG. 5 depicts a flowchart of a method for performing a first incoming read operation in accordance with an embodiment.

FIG. 5 depicts a flowchart 500 of an example method for performing a first incoming read operation in accordance with an embodiment. The method of flowchart 500 may be performed, for example, by read logic 138 in response to receiving a first incoming read operation. The method of flowchart 500 will now be described with continued reference to memory device 100 of FIG. 1, although the method is not limited to that implementation.

As shown in FIG. 5, the method of flowchart 500 begins at step 502, in which memory device 100 receives a first incoming read operation, including read index signals 108 and read bank address signals 110. At step 504, read logic 138 receives a cache line as cache output signal 122 that is selected by a cache lookup operation (e.g., R0 lookup operation as shown in FIG. 2) performed on cache 118. The cache line is selected using read index signals 108.

Step 506 is an optional step that is performed if the received cache line is encoded. In this step, decoding logic 142 receives an encoded cache line that is selected by the cache lookup operation that was performed on cache 118. Decoding logic 142 is configured to expand the encoded cache line to generate a longer, uncompressed cache line as output signals 144. If the received cache line is not encoded, flow continues from step 504 directly to step 508.

At step 508, data is read from a first physical memory bank (i.e., one of memory banks $170_0$-$170_{12}$) that is associated with the first incoming read operation. The first physical memory bank is identified by mapping a logical memory bank identified by read bank address signals 110 to a physical memory bank using an LTP bank map included within the cache line received during step 504. The read occurs at a location within the first physical memory bank specified by read index signals 108.

Figure 6:
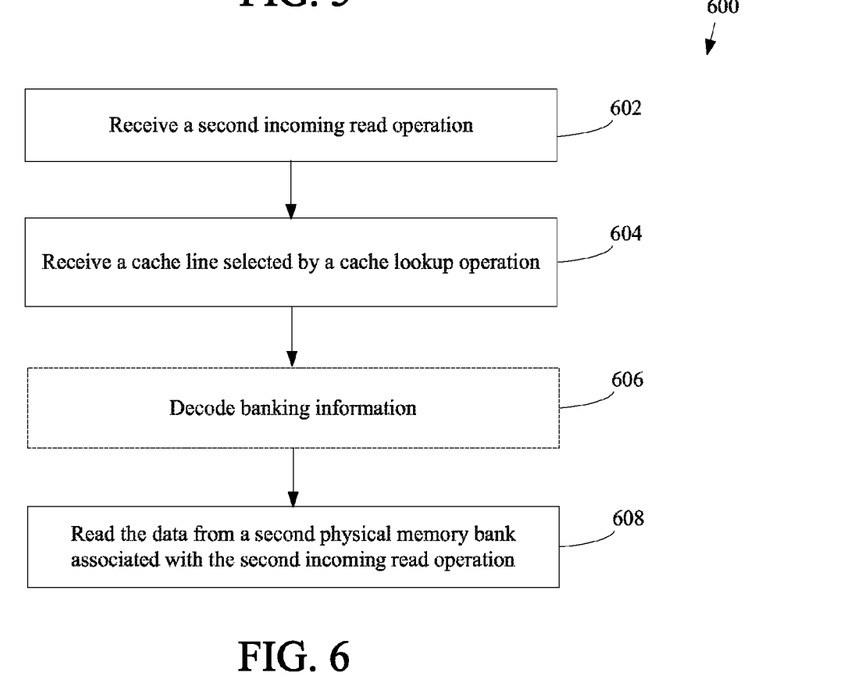
FIG. 6 depicts a flowchart of a method for performing a second incoming read operation in accordance with an embodiment.

FIG. 6 depicts a flowchart 600 of an example method for performing a second incoming read operation in accordance with an embodiment. The method of flowchart 600 may be performed, for example, by read logic 138 in response to receiving a second incoming read operation. The method of flowchart 600 will now be described with continued reference to memory device 100 of FIG. 1, although the method is not limited to that implementation.

As shown in FIG. 6, the method of flowchart 600 begins at step 602, in which memory device 100 receives a second incoming read operation, including read index signals 108 and read bank address signals 110. At step 604, read logic 138 receives a cache line as cache output signal 122 that is selected by cache lookup operation (e.g., R1 lookup operation as shown in FIG. 2) performed on cache 118. The cache line is selected using read index signals 108.

Step 606 is an optional step that is performed if the received cache line is encoded. In this step, decoding logic 142 receives an encoded cache line that is selected by the cache lookup operation that was performed on cache 118. Decoding logic 142 is configured to expand the encoded cache line to generate a longer, uncompressed cache line as output signals 144. If the received cache line is not encoded, flow continues from step 604 directly to step 608.

At step 608, data is read from a second physical memory bank (i.e., one of memory banks $170_0$-$170_{12}$) that is associated with the second incoming read operation. The second physical memory bank is identified by mapping a logical memory bank identified by read bank address signals 110 to a physical memory bank using an LTP bank map including within the cache line received during step 604. The read occurs at a location within the second physical memory bank specified by read index signals 108.

It is noted that the first incoming read operation and second incoming read operation described above with respect to flowcharts 500 and 600 may be received during the same clock cycle or during different clock cycles. In the event that both the first and second incoming read operations are received during the same clock cycle, read logic 122 may concurrently perform the steps described above with respect to flowcharts 500 and 600.

Figure 7:
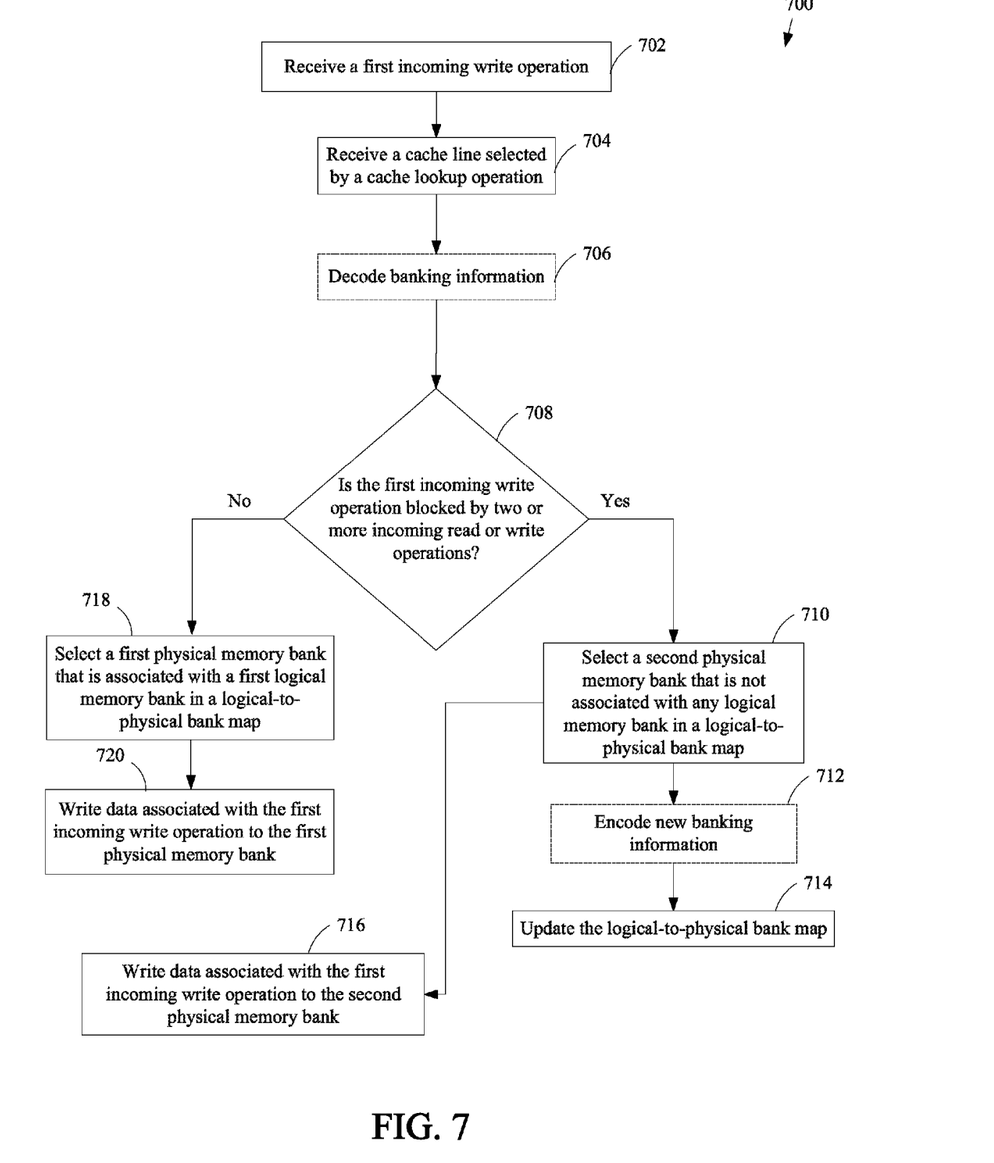
FIG. 7 depicts a flowchart of a method for performing a first incoming write operation in accordance with an embodiment.

FIG. 7 depicts a flowchart 700 of an example method for performing a first incoming write operation in accordance with an embodiment. The method of flowchart 700 may be performed by write logic 152 in response to memory device 100 receiving a first incoming write operation configured to write data to a first logical memory bank in a plurality of logical memory banks. The method of flowchart 700 will now be described with continued reference to memory device 100 of FIG. 1, although the method is not limited to that implementation.

As shown in FIG. 7, the method of flowchart 700 begins at step 702, in which memory device 100 receives a first incoming write operation configured to write data to a first logical memory bank in a plurality of logical memory banks. The first incoming write operation includes write index signals 104 and write bank address signals 106. At step 702, write logic 152 receives a cache line as cache output signal 120 that is selected by a cache lookup operation (e.g., W2 lookup operation or W3 lookup operation as shown in FIG. 2) performed on cache 118. The cache line may be selected using write index signals 104.

Step 706 is an optional step that is performed if the received cache line is encoded. In step 706, decoding logic 148 receives an encoded cache line that is selected by the cache lookup operation that was performed on cache 118. Decoding logic 148 is configured to expand the encoded cache line to generate a longer, uncompressed cache line as output signals 150. If the received cache line is not encoded, flow continues directly from step 704 to step 708.

At step 708, write logic 152 determines whether the first incoming write operation is blocked by two or more incoming read or write operations. Write logic 152 may determine that the first incoming write operation is blocked by two or more incoming read or write operations by reading cache 118 to identify the first physical memory bank that is associated with the first logical memory bank, reading cache 118 to identify a physical memory bank that is associated with a logical memory bank specified by the two or more incoming read or write operations, and comparing the first physical memory bank that is associated with the first logical memory bank and the physical memory bank that is associated with the logical memory bank specified by the two or more incoming read or write operations. If the first physical memory bank that is associated with the first logical memory bank is the same as the physical memory bank that is associated with the logical memory bank specified by the two or more incoming read or write operations then the first incoming write operation is blocked by the two or more incoming read or write operations. If write logic 152 determines that the first incoming write operation is blocked by the two or more incoming read or write operations then flow continues to step 710.

At step 710, write logic 152 selects a second physical memory bank (i.e., one of memory banks $170_0$-$170_{12}$) that is not associated with any logical memory bank in a LTP bank map.

Step 712 is an optional step that is performed only if cache line encoding is implemented. At step 712, encoding logic 158 receives signals 156 indicative of updates to the LTP bank map stored in cache 118. Received signals 156 may include a modified version of a cache line received as cache output signals 120. The modification may include representing the second physical memory bank as a physical memory bank identifier, and associating the physical memory bank identifier with the first logical memory bank. The modification may also include disassociating the first physical memory bank from any other logical memory bank. Encoding logic 158 encodes each cache line to generate a shorter representation thereof. Encoding logic 158 outputs the encoded cache lines to cache 118 as output signals 160.

At step 714, the LTP bank map is updated to associate the second physical memory bank with the first logical memory bank and to disassociate the first physical memory bank from any other logical memory bank.

At step 716, write data associated with the first incoming write operation is written to the second physical memory bank (i.e., one of memory banks $170_0$-$170_{12}$).

At step 718, a first physical memory bank that is associated with a first logical memory bank in the LTP bank map stored in cache 118 is selected in response to write logic 152 determining that the first incoming write operation is not blocked by two or more incoming read or write operations.

At step 720, write data associated with the first incoming write operation is written to the first physical memory bank (i.e., one of memory banks $170_0$-$170_{12}$).

Figure 8:
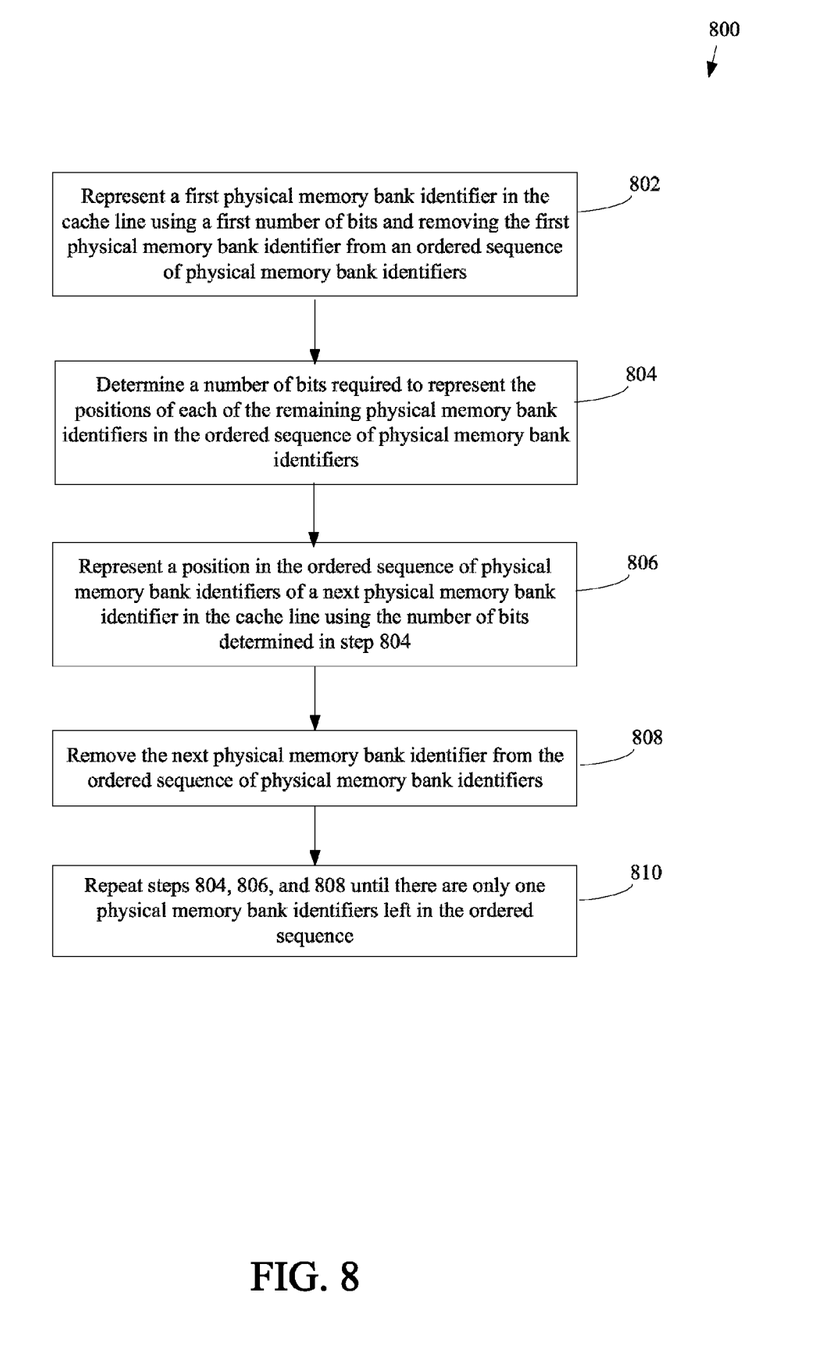
FIG. 8 depicts a flowchart of an encoding process performed by encoding logic in accordance with an embodiment.

FIG. 8 depicts a flowchart 800 of an example method that may be performed by encoding logic 158 to encode a cache line. The method of flowchart 800 will now be described with continued reference to memory device 100 of FIG. 1, although the method is not limited to that implementation. The method of flowchart 800 is optional because in case of very high clock frequency or very large number of memory banks, decoding may negatively impact read latency. While latency is more severely affected by decoding than encoding, if a cache line is encoded then it must be decoded at a later time. Thus both decoding and encoding may adversely affect latency.

As shown in FIG. 8, the method of flowchart 800 begins at step 802, in which encoding logic 158 represents a first physical memory bank identifier in a cache line stored in cache 118 using a first number of bits and removing the first physical memory bank identifier from an ordered sequence of physical memory bank identifiers. At step 804, encoding logic 158 determines a number of bits required to represent the positions of each of the remaining physical memory bank identifiers in the ordered sequence of physical memory bank identifiers. At step 806, encoding logic 158 represents a position in the ordered sequence of physical memory bank identifiers of a next physical memory bank identifier in the cache line using the number of bits determined in step 804. At step 808, encoding logic 158 removes the next physical memory bank identifier from the ordered sequence of physical memory bank identifiers. At step 810, encoding logic repeat steps 804, 806, and 808 until there are only one physical memory bank identifiers left in the ordered sequence. The last physical memory identifier always corresponds to a first position of the ordered sequence of physical memory bank identifiers, thus it does not need to be represented explicitly.

E. Other Example Embodiments

Embodiments described herein may generally be used with any type of memory. In one embodiment, the memory may be a circuit included on a device with other types of circuits. For example, the memory may be integrated into a processor device, a memory controller device, or other type of integrated circuit device. Devices into which the memory is integrated may include system-on-a-chip (SOC) devices. In another embodiment, the memory may be provided as a memory device that is used with a separate memory controller device or processor device.

Whether the memory is integrated into a device with other circuits or provided as a separate device, the memory may be used as part of a larger computer system. The computer system may include a motherboard, a central processor, a memory controller, a hard drive, a graphics processor, peripherals, and any other devices which may be found in a computer system in addition to the memory. The computer system may be part of a personal computer, a server compute, or a smaller system such as an embedded system, personal digital assistant (PDA), a tablet, or a mobile telephone.

In some cases, a device including the memory may be packaged together with other devices. Such packages may include any other types of devices, including devices with the same type of memory, devices with different types of memory, and/or devices including processors and/or memory controllers. Also, in some cases, the memory may be included in other devices, including memories, a buffer chip device, and/or a controller chip device.

In other cases, embodiments may be used with multiple types of memory or with a memory that is included on a device with multiple other types of memory. The memory types may include volatile memory and non-volatile memory. Volatile memories may include SRAM, pseudo-static random access memory (PSRAM), and dynamic random access memory (DRAM). DRAM types may include single data rate (SDR) DRAM, double data rate (DDR) DRAM, low power (LP) DDR DRAM, and any other type of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A memory device comprising:
    a plurality of physical memory banks;
    at least one cache that is configured to store a logical-to-physical bank map, the logical-to-physical bank map associating each one of a plurality of logical memory banks with a corresponding one of the plurality of physical memory banks; and
    control logic coupled to each of the plurality of physical memory banks and to the at least one cache, the control logic being configured to:
        determine whether a first incoming write operation configured to write data to a first logical memory bank in the plurality of logical memory banks is blocked by at least one incoming read operation;
        write data associated with the first incoming write operation to a first physical memory bank that is associated with the first logical memory bank in the logical-to-physical bank map in response to determining that the first incoming write operation is not blocked by the at least one incoming read operation; and
        write data associated with the first incoming write operation to a second physical memory bank that is not associated with any logical memory bank in the logical-to-physical bank map in response to determining that the first incoming write operation is blocked by the at least one incoming read operation.

2. The memory device of claim 1, wherein the control logic is further configured to perform the following in response to determining that the first incoming write operation is blocked by the at least one incoming read operation:
    update the logical-to-physical bank map to associate the second physical memory bank with the first logical memory bank; and update the logical-to-physical bank map to disassociate the first physical memory bank from any other logical memory bank.

3. The memory device of claim 1, wherein the control logic is configured to determine whether the first incoming write operation is blocked by two or more incoming read or write operations.

4. The memory device of claim 1, wherein the control logic is configured to determine whether the first incoming write operation is blocked by the at least one incoming read operation by at least:
reading the cache to identify the first physical memory bank that is associated with the first logical memory bank;
reading the cache to identify a physical memory bank that is associated with a logical memory bank specified by the at least one incoming read operation; and
comparing the first physical memory bank that is associated with the first logical memory bank to the physical memory bank that is associated with the logical memory bank specified by the at least one incoming read operation.

5. The memory device of claim 1, wherein the cache is configured to store a plurality of logical-to-physical bank maps, wherein each map is stored in a corresponding cache line indexed by a unique read/write address within a physical memory bank.

6. The memory device of claim 5, wherein each cache line includes a plurality of physical memory bank identifiers, wherein each of the physical memory bank identifiers is indexed by a corresponding logical memory bank identifier.

7. The memory device of claim 6, further comprising:
encoding logic that is configured to encode each cache line to generate a shorter representation thereof.

8. The memory device of claim 7, wherein the encoding logic is configured to encode a cache line by:
(a) representing a first physical memory bank identifier in the cache line using a first number of bits and removing the first physical memory bank identifier from an ordered sequence of physical memory bank identifiers;
(b) determining a number of bits required to represent positions of each of the remaining physical memory bank identifiers in the ordered sequence of physical memory bank identifiers;
(c) representing a position in the ordered sequence of physical memory bank identifiers of a next physical memory bank identifier in the cache line using the number of bits determined in step (b);
(d) removing the next physical memory bank identifier from the ordered sequence of physical memory bank identifiers; and
(e) repeating steps (b), (c) and (d) until there are only two physical memory bank identifiers left in the ordered sequence.

9. A method implemented by a memory device that includes a plurality of physical memory banks, comprising:
determining whether a first incoming write operation configured to write data to a first logical memory bank in a plurality of logical memory banks is blocked by at least one incoming read operation;
writing data associated with the first incoming write operation to a first physical memory bank that is associated with the first logical memory bank in a logical-to-physical bank map in response to determining that the first incoming write operation is not blocked by the at least one incoming read operation; and
writing data associated with the first incoming write operation to a second physical memory bank that is not associated with any logical memory bank in the logical-to-physical bank map in response to determining that the first incoming write operation is blocked by the at least one incoming read operation.

10. The method of claim 9, further comprising
updating the logical-to-physical bank map to associate the second physical memory bank with the first logical memory bank; and
updating the logical-to-physical bank map to disassociate the first physical memory bank from any other logical memory bank.

11. The method of claim 9, further comprising determining whether the first incoming write operation is blocked by two or more incoming read or write operations.

12. The method of claim 9, wherein determining whether the first incoming write operation is blocked by at least one incoming read operation comprises at least:
reading the cache to identify the first physical memory bank that is associated with the first logical memory bank;
reading a cache to identify a physical memory bank that is associated with a logical memory bank specified by the at least one incoming read operation; and
comparing the first physical memory bank that is associated with the first logical memory bank and the physical memory bank that is associated with the logical memory bank specified by the at least one incoming read operation.

13. The method of claim 9, further comprising:
storing a plurality of logical-to-physical bank maps in a corresponding cache line indexed by a unique read/write address within a physical memory bank.

14. The method of claim 13, further comprising:
indexing a plurality of physical memory bank identifiers included in each cache line by corresponding logical memory bank identifiers.

15. The method of claim 14, further comprising:
encoding each cache line to generate a shorter representation thereof.

16. The method of claim 15, wherein encoding each cache line to generate a shorter representation thereof comprises:
(a) representing a first physical memory bank identifier in the cache line using a first number of bits and removing the first physical memory bank identifier from an ordered sequence of physical memory bank identifiers;
(b) determining a number of bits required to represent positions of each of the remaining physical memory bank identifiers in the ordered sequence of physical memory bank identifiers;
(c) representing a position in the ordered sequence of physical memory bank identifiers of a next physical memory bank identifier in the cache line using the number of bits determined in step (b);
(d) removing the next physical memory bank identifier from the ordered sequence of physical memory bank identifiers; and
(e) repeating steps (b), (c), and (d) until there are only two physical memory bank identifiers left in the ordered sequence.

17. An apparatus, comprising:
control logic configured to be coupled to a plurality of memory banks and at least one cache, wherein the control logic is configured to:
determine whether a first incoming write operation configured to write data to a first logical memory bank in a plurality of logical memory banks is blocked by at least one incoming read operation;

write data associated with the first incoming write operation to a first physical memory bank that is associated with the first logical memory bank in a logical-to-physical bank map stored in the cache in response to determining that the first incoming write operation is not blocked by the at least one incoming read operation; and write data associated with the first incoming write operation to a second physical memory bank that is not associated with any logical memory bank in the logical-to-physical bank map in response to determining that the first incoming write operation is blocked by the at least one incoming read operation.

18. The apparatus of claim 17, wherein the control logic is further configured to perform the following in response to determining that the first incoming write operation is blocked by the at least one incoming read operation:

update the logical-to-physical bank map to associate the second physical memory bank with the first logical memory bank; and update the logical-to-physical bank map to disassociate the first physical memory bank from any other logical memory bank.

19. The apparatus of claim 17, wherein the control logic is configured to determine whether the first incoming write operation is blocked by two or more incoming read or write operations.

20. The apparatus of claim 17, wherein the control logic is further configured to determine whether the first incoming write operation is blocked by the at least one incoming read operation by at least:

reading the cache to identify the first physical memory bank that is associated with the first logical memory bank;

reading the cache to identify a physical memory bank that is associated with a logical memory bank specified by the at least one incoming read operation; and comparing the first physical memory bank that is associated with the first logical memory bank to the physical memory bank that is associated with the logical memory bank specified by the at least one incoming read operation.

\* \* \* \* \*